United States Patent [19]

Holdgrafer et al.

[11] Patent Number: 5,111,989
[45] Date of Patent: May 12, 1992

[54] METHOD OF MAKING LOW PROFILE FINE WIRE INTERCONNECTIONS

[75] Inventors: William J. Holdgrafer, Burlington, N.J.; Michael J. Sheaffer, Newtown; Lee R. Levine, New Tripoli, both of Pa.

[73] Assignee: Kulicke and Soffa Investments, Inc., Wilmington, Del.

[21] Appl. No.: 766,627

[22] Filed: Sep. 26, 1991

[51] Int. Cl.⁵ ............... B23K 20/10; H01L 21/607
[52] U.S. Cl. ............................. 228/110; 228/179
[58] Field of Search ............ 228/1.1, 4.5, 110, 111, 228/179

[56] References Cited

U.S. PATENT DOCUMENTS

| | | | |
|---|---|---|---|
| 3,235,945 | 2/1966 | Hall, Jr. et al. | 228/179 X |
| 3,623,649 | 11/1971 | Keisling | 228/4.5 |
| 4,327,860 | 5/1982 | Kirshenboin et al. | 228/179 |
| 4,600,138 | 7/1986 | Hill | 228/179 |
| 4,957,522 | 7/1986 | Kobayashi | 228/179 |

Primary Examiner—Kenneth J. Ramsey
Attorney, Agent, or Firm—John B. Sowell

[57] ABSTRACT

A novel method of making very low profile fine wire interconnections is accomplished with a conventional automatic gold wire ball bonder and includes the steps of making a conventional first ball bond and moving the bonding tool so as to pay out a length of wire that is shorter than the final desired length of wire to be used in the interconnection. The bonding tool is movingly engaged against the target on which the second bond is to be made employing a first bonding force which bends and conforms the wire beneath the working face of the capillary bonding tool and simultaneously forward extrudes and wire draws the neck of the fine wire into a tapered section which avoids backward extrusion. Subsequently a second bond force and ultrasonic energy is applied at the second bond target position to generate a conventional thermosonic second bond. The fine wire is bonded to the target by a thermocompression bond resulting from the moving first bonding force and the bond is interconnected to a conventional thermosonic bond resulting from the second bond force which produces a larger and stronger bond area than a conventional prior art second bond.

19 Claims, 5 Drawing Sheets

METHOD OF MAKING LOW PROFILE FINE WIRE INTERCONNECTIONS

BACKGROUND OF THE INVENTION

1. Field of the Invention

The present invention is related to a method of making very low profile fine wire interconnections between a conductive pad on a semiconductor device and a target bonding point on a lead frame or lead of a package. More particularly, the present invention relates to a novel method of forming slack free low profile fine wire interconnections between terminals on an integrated circuit and the lead out pads on a lead frame or package.

2. Description of the Prior Art

Automatic wire bonders are employed to make fine wire interconnections between semiconductor devices and lead out pads. Such automatic wire bonders are shown and described in U.S. Pat. No. 4,266,710 and are provided with microprocessor controls which enable the automatic wire bonder to be programmed to move its capillary bonding tool in a predetermined path at a predetermined velocity. The programmed path is different from the shape of the final fine wire interconnection and involves special method steps and knowledge of the resilience, strength, wire type and size of the fine wire being bonded.

U.S. Pat. No. 4,327,860 shows and describes a preferred method of making standard profile slack free fine wire interconnections. While this prior art method produces repeatable standard profile fine wire interconnections, it was found to be incapable of making low profile or very low profile interconnections of the type required for a use in Thin Small Outline Package (TSOP) applications such as smart cards. Thin packages require that the fine wire interconnections be slack free and have a loop height in the order of 3 to 10 one-thousandth of an inch (mils). While such interconnections can be made using special rotary head wedge bonders or Tape Automatic Bonding (TAB), at the time the present invention was made and tested it was not believed possible to make low profile fine wire lo interconnections for TSOP packages using an automatic gold wire ball wire bonder.

It would be highly desirable to provide a method of making low profile and very low profile fine wire interconnections using highly accurate and reliable automatic gold wire ball bonders.

SUMMARY OF THE INVENTION

It is a principal object of the present invention to provide a novel method of making slack free low profile fine wire interconnections with an automatic gold wire ball bonder.

It is another principal object of the present invention to provide a novel method of making a second bond of a fine wire interconnection which provides a stronger bond than prior art second bonds.

It is another principal object of the present invention to provide a novel elongated shaped second bond having a substantially enlarged wire bonded area.

It is another principal object of the present invention to provide a method of making a low profile fine wire interconnection by paying out a calculated final predetermined length of wire which is shorter than the needed length of wire in the interconnection and subsequently drawing the wire across the face of the capillary bonding tool by moving the bonding tool while applying a second bond force.

It is another principal object of the present invention to provide a method of making a novel second bond in two separate and distinct bonding steps.

It is another principal object of the present invention to provide a method of making second wire bonds which avoid problems of kinking and backward extrusion.

It is another principal object of the present invention to provide a method of making second wire bonds which include the steps of controlling forward extrusion and tensioning the fine wire being bonded at second bond.

It is another principal object of the present invention to provide a method of making a second wire bond which eliminates discontinuities in the fine wire adjacent to the second bond.

According to these and other objects of the present invention a first ball bond is made on a pad of a semiconductor device using a capillary bonding tool. The bonding tool is moved in a predetermined path to pay out a length of wire that is shorter than the final desired length of wire for the interconnection to be made. The capillary bonding tool is subsequently engaged against the lead on which a second bond is to be made with a first force which bends and conforms the wire between the lead and the working face of the bonding tool. As the wire begins to be mashed flat and extruded under this first force at the second bond, the bonding tool is continuously moved away from the first ball bond toward the second bond target position causing forward extrusion of the wire. The wire is drawn across the working face of the bonding capillary while eliminating reverse extrusion of the wire. A conventional second bond force is then applied to complete an elongated shaped second bond having a larger bonding area than prior art second bonds.

DESCRIPTION OF THE PREFERRED EMBODIMENT

Figure 1:
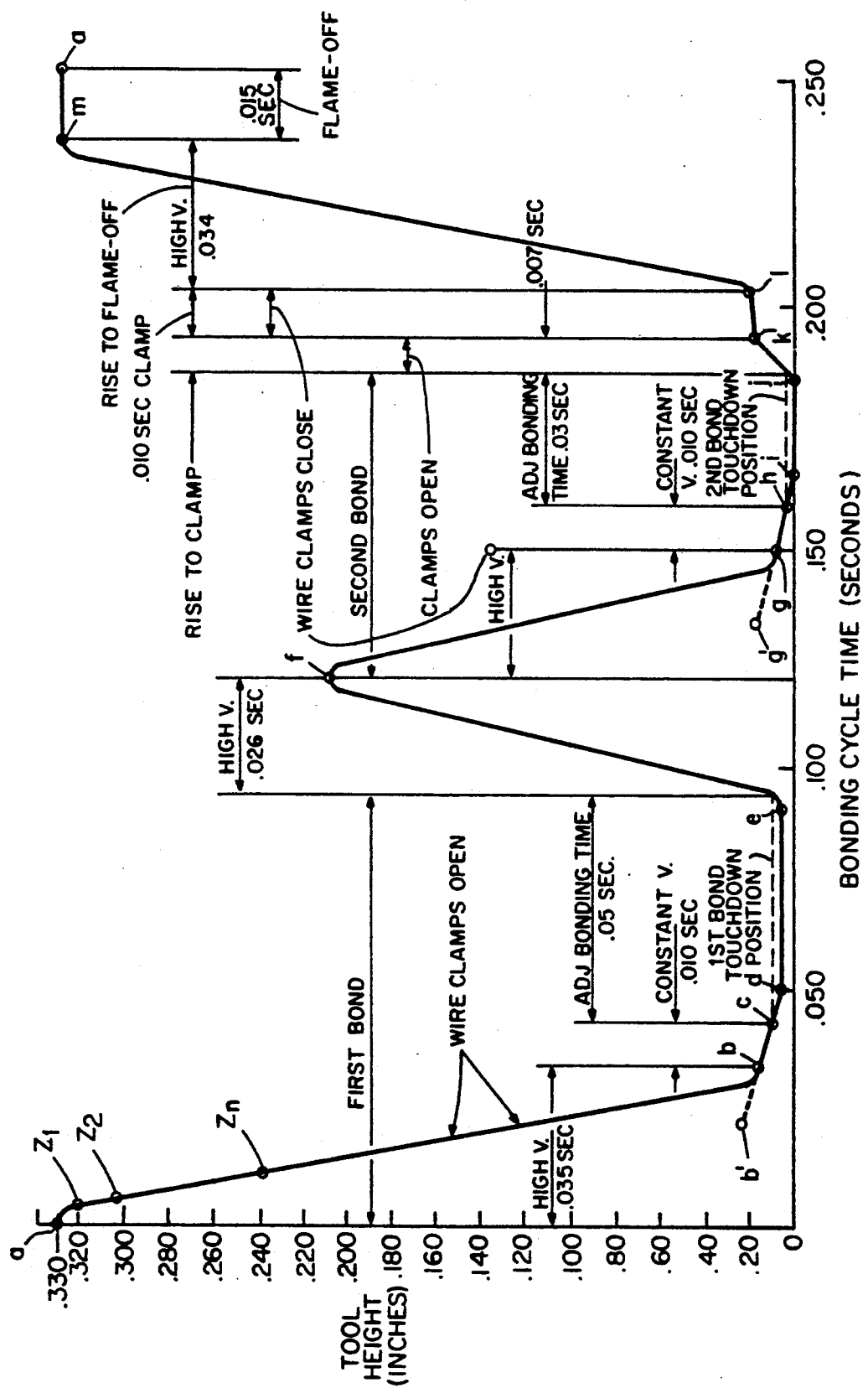
FIG. 1 is a schematic timing diagram showing the vertical height of a capillary bonding tool versus t time in seconds for a preferred embodiment typical prior art automatic wire bonder.

Refer now to FIG. 1 showing a schematic timing diagram for a prior art automatic wire bonder. This same diagram is shown and described in U.S. Pat. No. 4,266,710 assigned to Kulicke and Soffa Industries Inc., the same assignee as the assignee as the present invention. The diagram in FIG. 1 presents vertical movement of the working face of the capillary bonding tool versus time. At the reset position shown as point a, the bonding tool is typically approximately 0.33 inches above the surface of the device to be bonded. The first bonding target on the device has been positioned below the working face of the bonding tool and it is desirable to move the bonding tool vertically as fast as possible to the first bond position and to complete the first bond. Accordingly the bonding tool is accelerated to its highest or optimum velocity and this high velocity is maintained by constantly monitoring the control points $Z_1$, $Z_2$ and $Z_n$ down to a predetermined deceleration point shown as point b. At point b the bonding tool enters a period of linear velocity between points b and c which permits the bonding tool to engage the semiconductor device at known impact velocity which is shown as point d. The ball on the wire to be bonded engages the semiconductor device at point c which is shown as first bond touch down position and the bonding tool continues to mash and bond the ball up to the time shown as point e which is adjustable. After the completion of the first bond at point e, the bonding capillary is raised at high velocity until it reaches a predetermined height shown as point f. In the prior art preferred method of making slack free bonds, the wire clamps are still open at point f and remain open during the descent of the capillary bonding tool to approximately point g. At point g the wire clamps are closed and the bonding tool enters a constant velocity mode between points g and h at touch down. After the touch down position h is reached, a bonding force is applied which continues through points h, i and j shown as the adjustable bonding time for the second bond. The bonding tool is raised with the wire clamps open between points j and k to pay out a predetermined length of wire known as a tail. Between points k and l the wire clamps are closed and the capillary bonding tool is raised to the height shown at point m breaking the wire at the second bond. While the tail is extended from the capillary, heat is applied to cause the end of the wire to form a ball which occurs between points m and a, thus completing the bonding cycle. The same captions used in U.S. Pat. No. 4,266,710 are shown are FIG. 1 and a more detailed description of the operation of prior art automatic wire bonders will be found in this patent. When making low profile fine wire interconnections according to the present invention it is only necessary to modify the portion of the curve shown in FIG. 1 between the points f and j as will be described in greater detail hereinafter. The remaining portions of the curve are substantially the same as that shown in this prior art schematic timing diagram.

Figure 2:
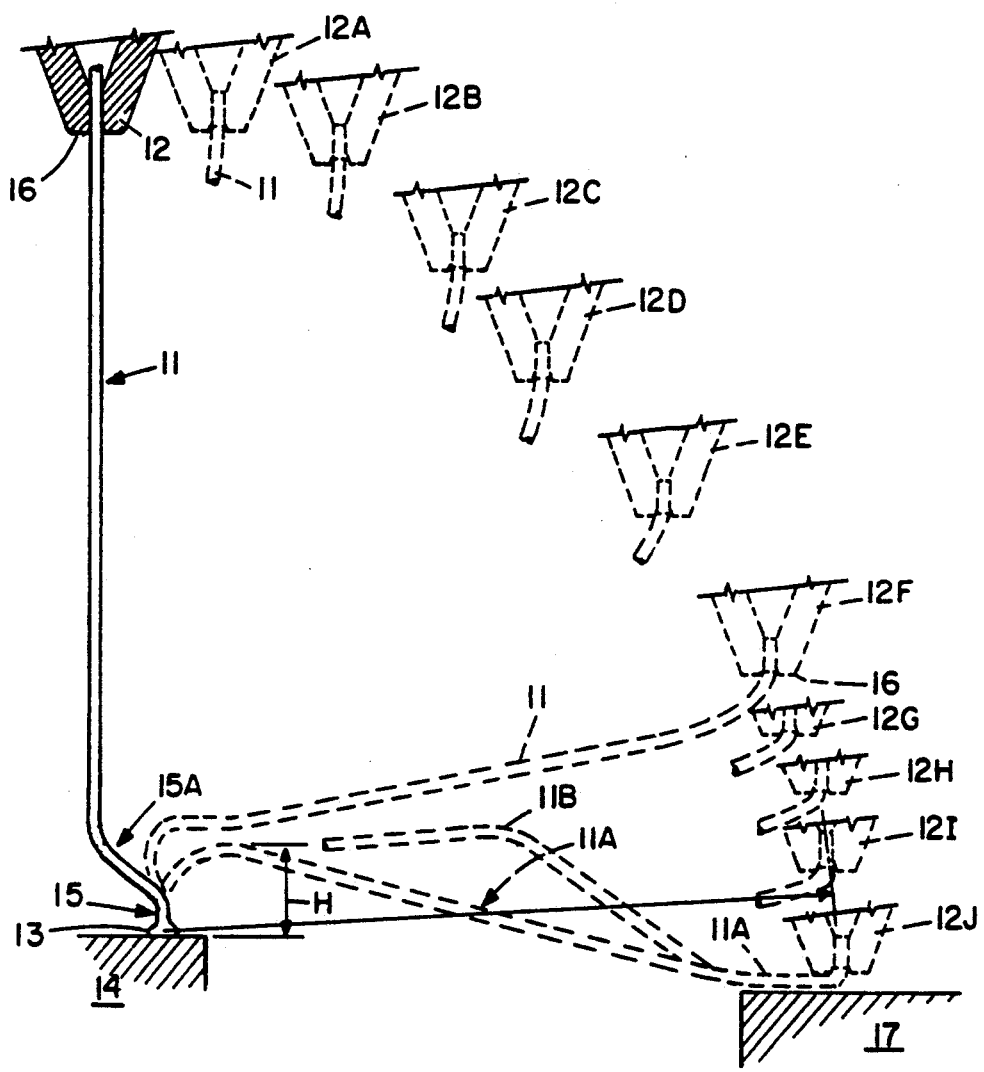
FIG. 2 is a schematic diagram showing the path taken by a capillary bonding tool in an automatic wire bonder programmed to make prior art slack free standard profile fine wire interconnection.

Refer now to FIG. 2 which is a schematic diagram showing the path taken by a capillary bonding tool in a prior art automatic wire bonder which is programmed to make slack free standard profile fine wire interconnections. Prior art FIG. 2 is shown and thoroughly described in U.S. Pat. No. 4,327,860 and is referred to as a teaching of reverse looping. The interconnection wire 11 is shown ball bonded to a first conductive pad 14 and the capillary bonding tool 12 is shown raised to its maximum height or rise point above the ball bond 13 to pay out a length of wire which is greater than that to be used in the interconnection. After o making the first ball bond 13 on the first conductive pad 14, the capillary bonding tool 12 is raised vertically a small amount, preferably between six and seventeen mils and then the bonding tool 12 is moved to the left in FIG. 2 which is a direction away from the second bond position. This vertical rise and subsequent movement in a rear or reverse direction away from the second bond forms a bend 15 adjacent to ball bond 13 and also forms a second bend 15A when the bonding tool 12 is raised vertically. The fine wire 11 extending from the working face 16 of the bonding tool 12 is shown as a straight fine wire. When the bonding tool moves to the position 12A, the fine wire is shown acquiring a slight skew or deviation from the vertical and is free to extend from or re-enter the throat of the bonding tool 12. As the bonding tool moves from position 12A to position 121, the fine wire 11 is permitted to re-enter the bonding tool so as to adjust the length of the fine wire interconnection. However, by the time the bonding tool 12 reaches the position 12F, the fine wire is substantially bent at the working face 16 of the bonding tool and a capstan effect or locking effect has taken place so that the wire is locked in the throat of the bonding tool 12. At this point in time, the bonding tool 12 is programmed to follow a path which approximately follows the radius R to avoid further straining the wire 11. The arcuate path is completed at the position 12J where all XY movement is ceased and the second bond will be made on a lead or pad 17. At the point of touchdown, the fine wire 11 has a height H and the path is shown by the wire designation 11A. When the bonding tool 12J mashes the wire 11, it is extruded in all directions from beneath the working face 16 of the bonding tool 12 as will be explained in detail hereinafter. This extrusion also takes place in the direction toward the first bond 13 which cause the wire 11A to kink or kickup as shown by the wire 11B. It has been determined that an extrusion which moves the wire 1/10th of one mil in the direction toward the bond 13 causes a rise of approximately one mil in the H direction (kickup direction) for an interconnection of 100 mils. This kinking or backward extrusion kickup is not as noticeable when the reverse looping technique shown in FIG. 2 is employed because there is some spring action of the wire curl above the ball 13 in the bends 15 and 15A which tends to keep the loop or interconnection slack free. However, when the height H of this standard loop is reduced to a value at or below ten mils it is difficult or not impossible to produce low profile fine wire interconnections using this desirable technique.

Figure 3:
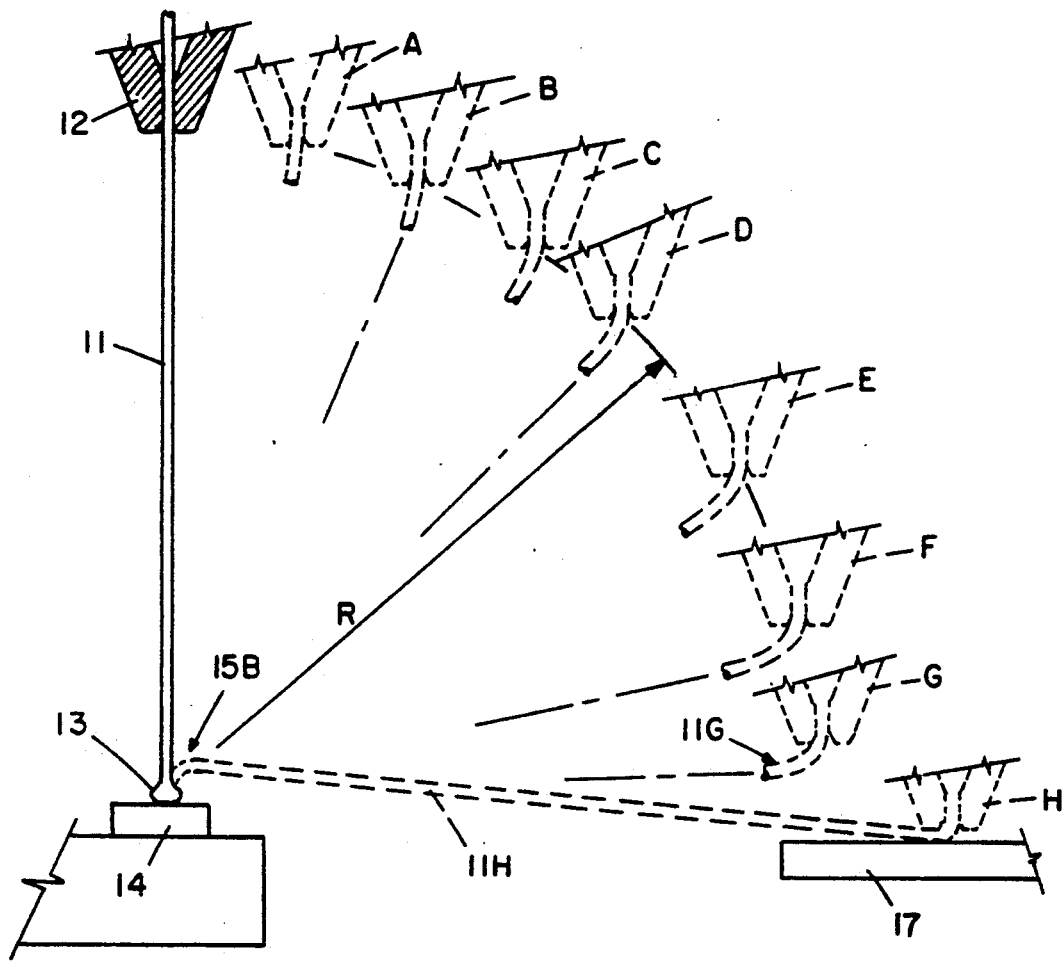
FIG. 3 is a schematic diagram showing the present invention preferred embodiment path taken by a capillary bonding tool of a automatic wire bonder which is programmed to make slack free low profile fine wire interconnections according to the present invention.

Refer now to FIG. 3 which is schematic diagram showing the present invention preferred path taken by a capillary bonding tool. While it is possible to raise the capillary 12 in the reverse looping path shown in FIG. 2 a lower profile fine wire interconnection may be made using the method to be described in FIG. 3 wherein the capillary bonding tool 12 is raised vertically to the position shown to payout an exact predetermined length of fine wire 11 which is actually shorter than the length of wire needed in the final interconnection or loop shown as 11H. In the preferred embodiment of the present invention, the length of wire is critical and the wire is clamped above the capillary bonding tool 12 by wire clamps (not shown) before the bonding tool 12 is moved in an arcuate path shown by positions A through G toward the second bonding pad or lead 17. Only after the bonding tool reaches the final bond position H are the wire clamps opened. The bonding tool G is moved to a touchdown position which is short of the position H shown. After touching down a first bonding force is applied and the bonding tool is moved to the right toward the position H where a second and final bonding force with applied ultrasonic energy is applied to finish making the second bond as will be explained in detail hereinafter. It will be noted that an arcuate path is shown by a radius R. It is only necessary that the path taken by the bonding tool 12 be approximately equal to or less than the radius R so as to prevent exerting tension forces on the wire 11 in its movement from position A to G. Excessive tension in the wire 11 would create stresses in the bend at 15B above the ball 13. The low profile interconnection or loop 11H is an accurate representation of the final interconnection made by the present invention because there is no backward extrusion which causes a kink of kickup as explained with reference to prior art FIG. 2.

Figure 4:
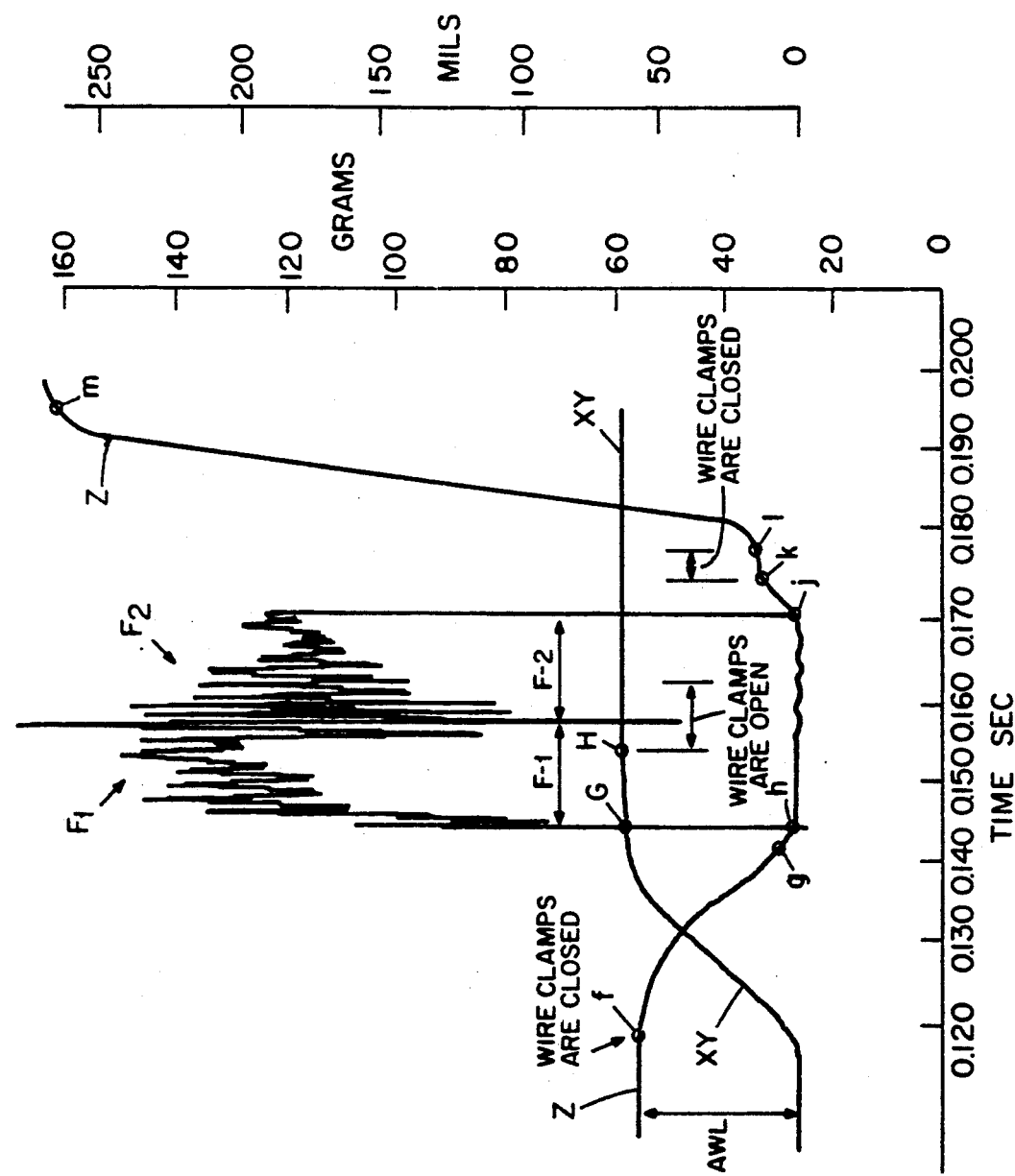
FIG. 4 is an enlarged schematic diagram of a portion of a bonding cycle at the second bond position showing both vertical or Z motion of the capillary and horizontal or XY motion of the capillary bonding tool when programmed to make low profile slack free interconnections according to the present invention.

Refer now to FIG. 4 which is an enlarged schematic diagram showing the XY and Z path taken by the capillary bonding tool 12 of an automatic wire bonder programmed to make low profile slack free interconnections lo according to the present invention. The FIG. 4 curve or diagram is designed to illustrate the movement of the bonding tool at the second bond portion of bond cycle. For purposes of the present invention the first part of the bond cycle up to point f may be considered to be the same as shown in FIG. 1. At point f of the curve marked Z to indicate the Z motion of the bonding tool, the wire clamps (not shown) are closed and the adjusted wire length (AWL) of the precalculated length of wire above first bond 13 as shown in FIG. 3 is approximately sixty mils. The time base for point f of curve Z has been shifted so that the time base in seconds is approximately equal to the curve shown in FIG. 3 to enable rapid comparison of the two curves.

At the same time the capillary bonding tool 12 is moving down in the Z direction toward the second target bonding points on lead 17, the bonding tool 12 is being moved closer to the second target bonding point as shown by the curve XY. Reference zero for curve XY is at first bond 13.

Point g on curve Z indicates the point where the Z motion of the bonding tool starts its constant velocity approach to touchdown on lead 17, Point G on curve XY and point h on curve Z are at the touchdown points which occur in time at or slightly before the application of the first portion of the second bonding force shown occurring during time F-1. It will be noted that curve XY is sloped between points G and H indicating that the capillary bonding tool 12 is moving horizontally while the first bonding force F1 is being applied and continues to be applied after all XY horizontal movement ceases as shown at point H. At or shortly after point H on curve XY, the wire clamps are preferably opened so that they will be opened at point j of curve Z at the completion of the second bond. Second bond is completed by application of a second bonding force F2 and ultrasonic energy which preferably occurs at time F-2 as a continuation of the first bond force F1.

Both bond forces F1 and F2 are programmable as to times F-1 and F-2 as well as forces F1 and F2 when an ultrasonic generator is used to make the novel second bond it is not turned on until or slightly after point H where horizontal motion of the bonding tool has ceased. In the preferred embodiment of the present invention, the force F1 is shown to be approximately 127 grams and the force F2 is shown to be approximately 100 grams. Both forces are programmable up to approximately 500 grams. The purpose of the first bonding force F1 is to flatten and extrude the wire 11 under the working force 10 of bonding tool 12 while simultaneously moving the bonding tool 12 away from the first bond 13. When sufficient first bond force F1 is applied, the wire under the tool 12 is reduced in cross-section and also partially bonded to lead 17. When the tool 12 moves with force F1 applied, the wire 11 is forwarded extended or swaged so that there is no reverse extrusion of the type which produces kinks or kickup as occurs when the bonding tool is directed vertically downward at second bond without horizontal movement.

By properly selecting a predetermined adjusted wire length (AWL) the bonding tool at point G has created a tight low profile loop before a bonding force is applied. The simultaneous movement of bonding tool 12 horizontally and application of force F1 generates a pull down effect on the wire loop and also prevents backward or reverse extrusion. The first bonding force also creates a synergistic effect at second bond in that a thermocompression bond is created during movement of the bonding tool which increases the bonded area outside of the bond area which occurs after the bonding tool ceases movement and the second bond force F2 is applied. The amount of preferred XY movement during time F1 has been determined to be from one half to two times the diameter of the fine wire being bonded using a gold wire. Thus, a gold wire having a diameter of 1 mil has been repeatedly bonded using an XY movement of 0.5 to 2.0 mils with 1.6 mils being used for loop heights H of 4 to 6 mils using one mil wire.

In the preferred embodiment of the present invention, curves XY and Z illustrate that the slope of curve XY is much flatter about point G than curve Z at points g and h which shows that the loop is pulled tight at the point of touchdown and further XY movement of the capillary bonding tool 12 is preferably employed to eliminate backward extrusion and kickup as explained hereinbefore. Forward extrusion adds length to the AWL as will be explained hereinafter. Movement of the bonding tool while generating a thermocompression bond prior to making a conventional thermosonic bond creates a large composite bonded wire area that is stronger in pull test than a thermosonic bond alone.

Figure 5:
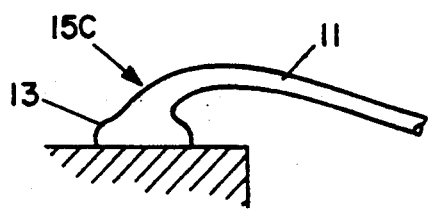
FIG. 5 is an enlarged pictorial representation of the first bond of a low profile slack free fine wire interconnection after pull down.

Refer now to FIG. 5 showing an enlarged pictorial representation of the first bond of a low profile slack free wire interconnection after pull down. The ball 13 is shown having a neck 15C which is pulled down to an extremely low profile in the area that was heat affected by the ball 13. By not using a reverse looping motion as explained in FIG. 2, the heat affected area at the bend 15C is not placed under two stress bonding operations, thus the neck area 15C is not weakened or work hardened.

Figure 6:
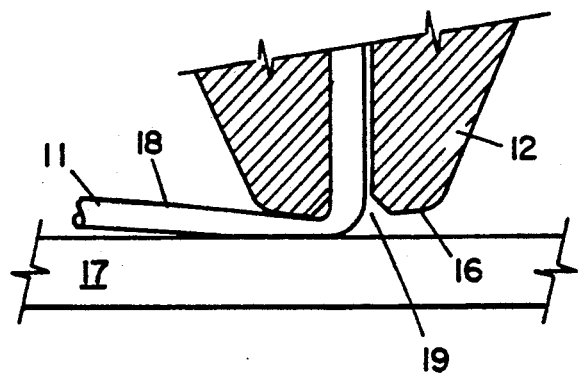
FIG. 6 is an enlarged pictorial representation of the capillary bonding tool making the second bond of a low profile slack free fine wire interconnection.

Refer now to FIG. 6 showing an enlarged pictorial representation of the capillary bonding tool at the start of making the second bond. It will be noted that the wire 11 starts to taper down at point 18 substantially uniform under the working face 16 of the bonding tool 12. Bonding tool 12 is shown having a 90 to 120 degree innerchamfer and a zero to eight degree working face 16. As is well known in the prior art, the intersection of the innerchamfer and the working face creates a sharp wedge type structure which pinches off the wire 11 to the point where a slight pull or tug will cause the wire to break as is shown in FIG. 7.

Figure 7:
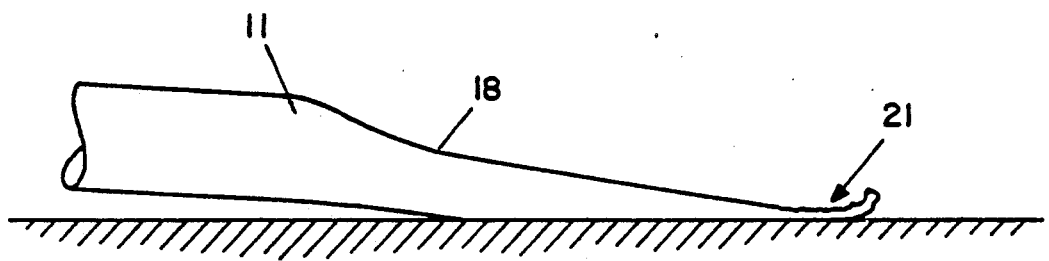
FIG. 7 is a greatly enlarged front elevation of the fine wire shown in FIG. 6 after being bonded to a lead frame lead.

Refer now to FIG. 7 showing a greatly enlarged front elevation of the fine wire 11 after being bonded by a tool shown in FIG. 6. The tapered section 18 is well outside of the working face of the bonding tool 12 and was formed by movement of the capillary bonding tool 12 toward the final bond position shown in FIG. G and FIG. 8 generating a wire drawing or extrusion effect. The wire 11 at point 21 was under the wedge of the interchamfer and has substantially no thickness, thus when the wire is pulled, the break occurs at or near this thin section at point 21 which is at the annular wedge.

Figure 8:
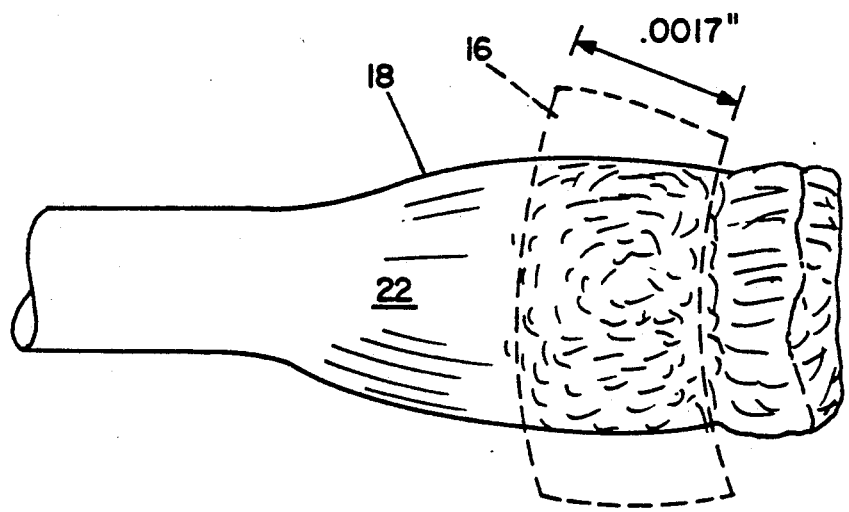
FIG. 8 is a top view of the fine wire shown in FIG. 7 illustrating the novel elongated second bond produced by the novel method of the present invention.

Refer now to FIG. 8 which is a top view of the fine wire shown in FIG. 7 and having superimposed thereon in phantom section a sector of the working face 16 of the bonding tool 12. FIG. 7 illustrates that to the left of the sector 16 a widening or paddle shape 22 occurs which is bonded to the lead frame lead 17. Area 22 is outside of the o second force F2 areas of the working face of the bonding tool 16 and is thermocompression bonding. The total bonded area of the wire has been increased by the two step bonding force approach of the present invention. Moreover, the taper shown at point 18 is completely outside of the zone that is affected by the ultrasonic energy applied by the working face 16 of the bonding tool 12. Thus, eliminating the possibility that reworking (hardworking) of the tapered area would weaken the wire adjacent to the bond. It has been determined by separating the bonded wire from a lead at second bond and then making a photograph using a back scattered electron mode scanning electron microscope enlargement that the area 22 shown in FIG. 8 just outside of the working area 16 of the bonding tool 12 which is thermocompression bonded to the lead frame lead 17 and is lo separated and distinct from the thermosonic bonding area under working face 16 thus creating a larger bonded area which has a stronger pull strength than prior art bonds.

Having explained a preferred embodiment of the present invention, it will be understood that several significant steps are employed in making the second bond which were not employed heretofore. The principal step that creates the low profile fine wire interconnection is the continuous movement of the bonding tool during a second bond bonding operation which has not been performed heretofore. While the purpose of the movement of the bonding tool during the second bond operation was to completely remove the slack in the bond, it was found that by applying a two stage force (or a controlled application of a continuous second bond force) that an extrusion effect takes place which creates a larger bonding area and prevents reverse extrusion. It will be appreciated that the first force at a second bonding point creates a thermocompression bond and that the second force creates a thermosonic bond. Since the thermocompression bond is less prone to work hardening and is molecularly bonded to the lead frame 17, the final second bond is stronger than second bonds produced by prior art methods.

What is claimed is:

1. A method of making low profile slack free fine wire interconnections, comprising the steps of:
    making a first ball bond with a capillary bonding tool at the end of a fine wire to be connected to a lead frame,
    paying out the fine wire from the capillary while moving from said first ball bond to a point on the lead frame short of the second bond target position,
    engaging said fine wire against said lead frame with a first bonding force,
    simultaneously mashing, forward extruding and wire drawing said fine wire under the working face of said capillary bonding tool while moving away from said first ball bond to said second bond target position, and
    bonding said fine wire to said lead frame using a second bond force and the application of ultrasonic energy.

2. The method as set forth in claim 1 wherein the step of engaging said fine wire with a first bonding force comprises applying a force great enough to forward extrude said fine wire before bonding said fine wire to said lead frame.

3. The method as set forth in claim 1 wherein the step of engaging said fine wire with a first bonding force comprises applying a force between 10 and 200 grams.

4. The method as set forth in claim 2 wherein the step of applying said second bonding force comprises applying a force between 50 and 150 grams.

5. The method as set forth in claim 1 wherein the step of simultaneously moving and bonding said fine wire with said first bonding force at second bond position comprises moving a distance greater than the amount of backward extrusion.

6. The method as set forth in claim 5 wherein the distance moved that is greater than the amount of the backward extrusion comprises moving a distance between 0.5 and 2.0 mils.

7. The method as set forth in claim 6 wherein the distance moved that is greater than the amount of backward extrusion comprises moving a distance of approximately 0.1 mils for each 1.0 mils reduction in the pull down loop height of said low profile fine wire interconnection.

8. The method as set forth in claim 1 which further includes the step of:
    restraining said fine wire from movement in the capillary until shortly before bonding said fine wire after moving said fine wire to said second bond target position.

9. The method as set forth in claim 8 which further includes the step of restraining said fine wire from movement in said capillary bonding tool comprises bending the wire under the working face of the capillary bonding tool while simultaneously moving said capillary bonding tool to a final second bond target position.

10. The method as set forth in claim 9 which further includes the step of restraining said fine wire from movement in said capillary bonding tool comprises clamping said wire above said capillary bonding tool after paying out said fine wire from said first ball bond.

11. The method of making low profile slack free wire interconnections between a first bonding point and a second bonding point comprising the steps of:

making a ball bond at said first bonding point employing a capillary bonding tool mounted in an automatic wire bonder, moving the capillary bonding tool in a predetermined path to a bonding position short of said second bonding point and simultaneously, paying out a length of wire which is shorter than the desired length of wire to be provided in said fine wire interconnection, wire drawing an additional length of wire under said capillary bonding tool while moving said capillary bonding tool to said second bondinq point, and making a capillary wedge bond at said second bonding point.

12. The method as set forth in claim 11 wherein the step of making a capillary wedge bond comprises the steps of simultaneously wire drawing, mashing and forward extruding said fine wire.

13. The method as set forth in claim 12 wherein the step of making a wedge bond at said second bonding point comprises applying a plurality of different bonding forces.

14. A method as set forth in claim 12 wherein the step of making a wedge bond at said second bonding point comprises applying a first bonding force while moving said capillary bonding tool and applying a second bonding force at said second bonding point after ceasing movement to complete said wedge bond.

15. The method as set forth in claim 11 wherein the step of making a wedge bond comprises applying a continuously increasing bonding force while moving said capillary bonding tool to said second bonding position and completing said second bond by applying the second bonding force and ultrasonic energy.

16. A method of making low profile slack free fine wire interconnections between a first bonding point on a semiconductor chip and a second bonding point on a lead frame lead comprising the steps of:

bonding the end of a fine wire to a pad of a semiconductor chip at a first bonding point employing a bonding tool mounted in a automatic wire bonder, raising the bonding tool to payout a total predetermined length of wire which is slightly smaller than the amount of wire required for a final wire interconnection, closing the wire clamps of the automatic wire bonder to prevent movement of said fine wire through the capillary bonding tool, moving said bonding tool horizontally and vertically toward an artificially generated second bonding point on a lead frame lead to create a conventional low loop height interconnection fine wire loop leaving a wire curl extending from the bonding tool, applying a first bonding force to said bonding tool that is sufficient to effect a secondary bond and is also sufficient to reduce the cross section of said fine wire at said artificially generated second bonding point, simultaneously moving said capillary bonding tool toward the desired said second bonding point while mashing said fine wire between said lead frame lead and the working face of said moving bonding tool, reducing the loop height of said fine wire interconnection by applying a pull down tension force on the conventional low loop by clamping said fine wire and moving said bonding tool to said second bonding point, and applying a second bonding force and ultrasonic energy to said bonding tool at said second bonding point for generating a second bond.

17. A method of making low profile slack free fine wire interconnections as set forth in claim 16 wherein said step of applying a first bonding force generates a secondary bond area under said fine wire in addition to the bond area of said second bond.

18. A method of making a second bond on a slack free fine wire interconnection after completing a first bond, comprising the steps of:

moving a bonding tool with a fine wire under the working face of the bonding tool into engagement with a bonding target, applying first bonding force on said bonding tool while simultaneously moving said bonding tool horizontally for generating a thermocompression bond between said fine wire and said bonding target, ceasing horizontal movement of said bonding tool, simultaneously applying a second bonding force and ultrasonic energy on said bondinq tool for generating a thermosonic bond between said fine wire and said bonding target, whereby, said second bond comprises a larger bonded area than a thermosonic bond alone.

19. A method as set forth in claim 18 wherein said second bond comprises interconnected areas of thermosonic bonded wire material and thermocompression bonded wire material.

* * * * *